United States Patent
Ichinohe

(10) Patent No.: US 11,335,619 B2
(45) Date of Patent: May 17, 2022

(54) SEMICONDUCTOR DEVICE

(71) Applicant: Mitsubishi Electric Corporation, Tokyo (JP)

(72) Inventor: Hiroaki Ichinohe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/756,450

(22) PCT Filed: Dec. 27, 2017

(86) PCT No.: PCT/JP2017/046929
§ 371 (c)(1),
(2) Date: Apr. 15, 2020

(87) PCT Pub. No.: WO2019/130474
PCT Pub. Date: Jul. 4, 2019

(65) Prior Publication Data
US 2020/0258806 A1    Aug. 13, 2020

(51) Int. Cl.
*H01L 23/367* (2006.01)
*H01L 23/31* (2006.01)
(Continued)

(52) U.S. Cl.
CPC ........ *H01L 23/367* (2013.01); *H01L 23/3121* (2013.01); *H01L 23/49811* (2013.01); *H01L 23/49861* (2013.01); *H01L 24/45* (2013.01)

(58) Field of Classification Search
CPC ............. H01L 23/36; H01L 2023/4043; H01L 2023/4087
See application file for complete search history.

(56) References Cited

U.S. PATENT DOCUMENTS 6,117,709 A    9/2000  Hirose
10,199,303 B1 *  2/2019  Sanchez .............. H01L 21/4825
(Continued)

FOREIGN PATENT DOCUMENTS

JP    S48066776 A    9/1973
JP    S52105970 A    9/1977
(Continued)

OTHER PUBLICATIONS

International Search Report issued in PCT/JP2017/046929; dated Mar. 13, 2018.
(Continued)

*Primary Examiner* — Yu-Hsi D Sun
(74) *Attorney, Agent, or Firm* — Studebaker & Brackett PC

(57) ABSTRACT

A semiconductor device, including: a heat sink which has a mounting surface, a heat radiation surface, a side surface and an engagement part, a semiconductor chip which is mounted on the mounting surface of the heat sink, a lead frame which is engaged with the engagement part of the heat sink, and a mold resin which seals the heat sink, the semiconductor chip and the lead frame, wherein the engagement part of the heat sink is disposed at a place which avoids the mounting surface of the heat sink. The engagement part of the heat sink is a dowel formed in the heat radiation surface of the heat sink. Further, the engagement part of the heat sink is a dowel formed in the side surface of the heat sink.

16 Claims, 8 Drawing Sheets

(51) Int. Cl.
  *H01L 23/498* (2006.01)
  *H01L 23/00* (2006.01)

(56) References Cited

U.S. PATENT DOCUMENTS

2006/0133044 A1  6/2006  Kim et al.
2007/0284993 A1  12/2007 Kim et al.
2008/0303052 A1  12/2008 Lee et al.

FOREIGN PATENT DOCUMENTS

| JP | S60103651 A   | 6/1985  |
| JP | H10284658 A   | 10/1998 |
| JP | H11145364 A   | 5/1999  |
| JP | 2004103790 A  | 4/2004  |
| JP | 2005-011899 A | 1/2005  |
| JP | 2006-073670 A | 3/2006  |
| JP | 2015-035554 A | 2/2015  |
| KR | 10-0579397 B1 | 5/2006  |

OTHER PUBLICATIONS

An Office Action mailed by the Korean Intellectual Property Office dated Jun. 17, 2021, which corresponds to Korean Patent Application 10-2020-7016680 and is related to U.S. Appl. No. 16/756,450; with English language translation.

\* cited by examiner

FIG.6 100
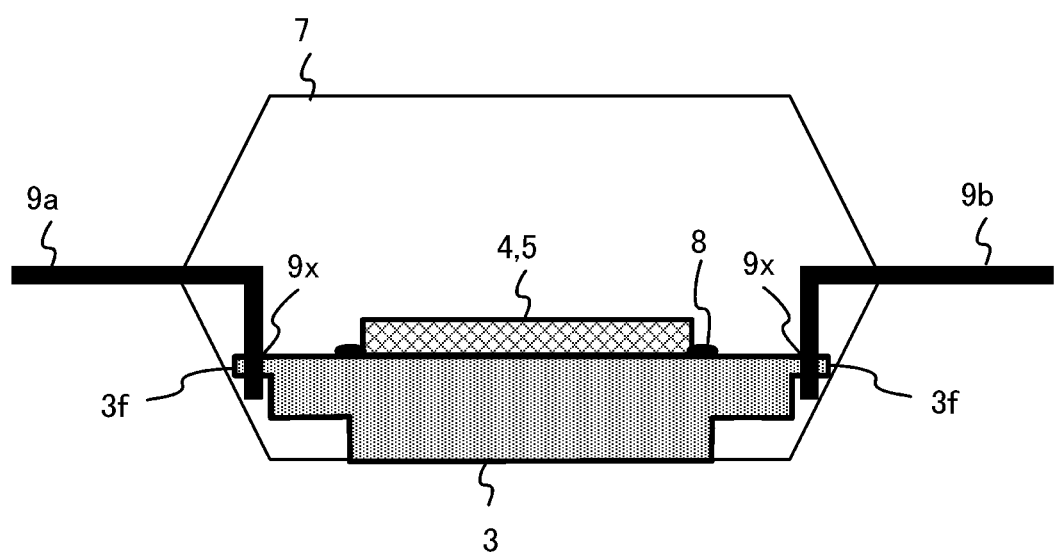
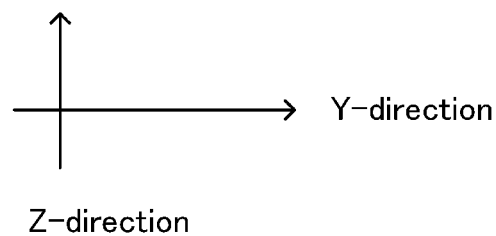

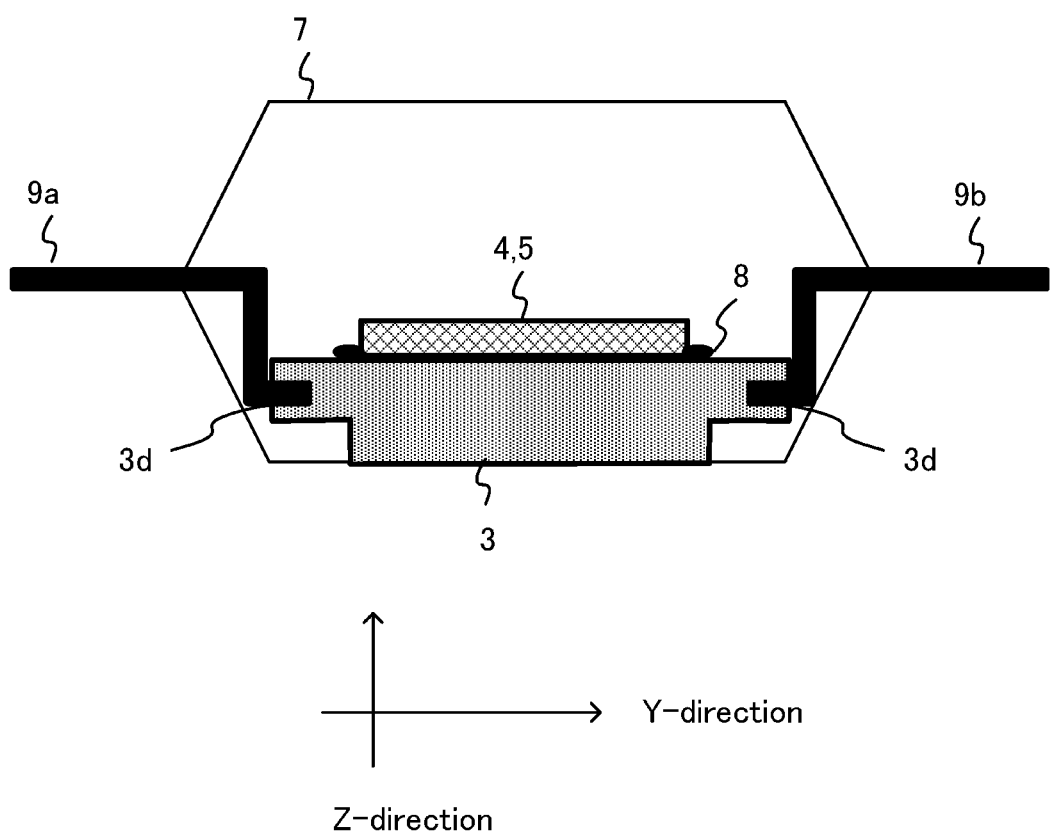

SEMICONDUCTOR DEVICE

FIELD OF THE INVENTION

The present application relates to a semiconductor device, and in particular, relates to the structure of a semiconductor device which is provided with a lead frame and a heat sink.

BACKGROUND OF THE INVENTION

The base station for mobile phones represents a device market of wireless communication. At present, Si devices, GaAs devices and the like predominate in the device market of wireless communication. In a field to which higher output power is oriented, wider bandwidths, reduced sizes and the like are required of the semiconductor device, due to the increase of communication capacity (for example, refer to Patent Document 1). Accordingly, in the field to which higher output power is oriented, the requirement for the lower cost of the semiconductor device is strict, while GaN devices are becoming mainstream.

Also in the GaN device, the study of low cost mold package structure in which lead frames are sealed with mold resin has been in progress. In the mold package structure, lead frames having a heat sink of copper or copper alloy system or others are used, in order to secure the heat dissipation performance of a semiconductor chip. For example, a semiconductor device in which a dowel provided on the upper surface of a heat sink and a lead frame are fixed together by swaging has been under development. According to the above semiconductor device, the reduction in size of a package is disturbed, because, on the upper surface of the heat sink, there exists a region in which component mounting cannot be performed.

There is known a structure having, at the both ends of a radiation substrate (a heat sink), trapezoidal convex parts with a long upper hem and a short lower hem (for example, refer to Patent Document 2). Groove shaped concave parts which can coincide with the above described trapezoidal convex parts are provided on the lower part of a lead supporting member. The concave parts and the convex parts are fitted with each other. According to the above structure, a region in which component mounting cannot be performed is produced on the upper surface of a heat sink, because there exists at the both ends of the heat sink a region which is used for fitting. A semiconductor device with this type of structure is not suitable for achieving the reduction in size of a package.

Further, there is known a structure in which a lead is inserted, from an upper direction, into an attachment opening, which is provided so as to penetrate from the lower surface through the upper surface of a loading member (for example, refer to Patent Document 3). In the above structure, the attachment opening is provided on the loading member. Because a lead will be inserted into the opening, a region in which component mounting cannot be performed is produced on the upper surface of the loading member. Accordingly, this type of semiconductor device is also not suitable for achieving the reduction in size of a package.

CITATION LIST

Patent Literature

Patent Document 1: JP S52-150970 A
Patent Document 2: JP S48-066776 A
Patent Document 3: JP 2004-103790 A

SUMMARY OF THE INVENTION

Technical Problem

As explained above, with regard to the semiconductor device in which a lead frame is fixed by swaging with a dowel provided on the upper surface of a heat sink, the reduction in size of a package is disturbed, since the region in which component mounting cannot be performed is produced on the upper surface of the heat sink. The present application aims at providing a lead frame structure and a semiconductor device, in which component mounting can be performed over the whole region of the upper surface of the heat sink.

Solution to Problem

A semiconductor device which is disclosed in the specification of the present application includes: a heat sink which has a mounting surface, a heat radiation surface, a side surface and an engagement part, a semiconductor chip which is mounted on the mounting surface of the heat sink, a lead frame which is engaged with the engagement part of the heat sink, and a mold resin which seals the heat sink, the semiconductor chip and the lead frame, wherein the engagement part of the heat sink is disposed at a place which avoids the mounting surface of the heat sink.

Advantageous Effects of Invention

The semiconductor device which is disclosed in the specification of the present application includes: a heat sink which has a mounting surface, a heat radiation surface, a side surface and an engagement part, a semiconductor chip which is mounted on the mounting surface of the heat sink, a lead frame which is engaged with the engagement part of the heat sink, and a mold resin which seals the heat sink, the semiconductor chip and the lead frame, wherein the engagement part of the heat sink is disposed at a place which avoids the mounting surface of the heat sink. Therefore, it is possible to provide a lead frame structure and a semiconductor device, in which component mounting can be performed over the whole region of the upper surface of the heat sink.

BRIEF DESCRIPTION OF THE DRAWINGS

FIG. 6 is a drawing which explains the structure of the lead frames of a semiconductor device in accordance with Embodiment 2.

FIG. 8 is a drawing which explains the structure of the lead frames of a semiconductor device in accordance with Embodiment 4.

DETAILED DESCRIPTION OF THE INVENTION

Figure 1:
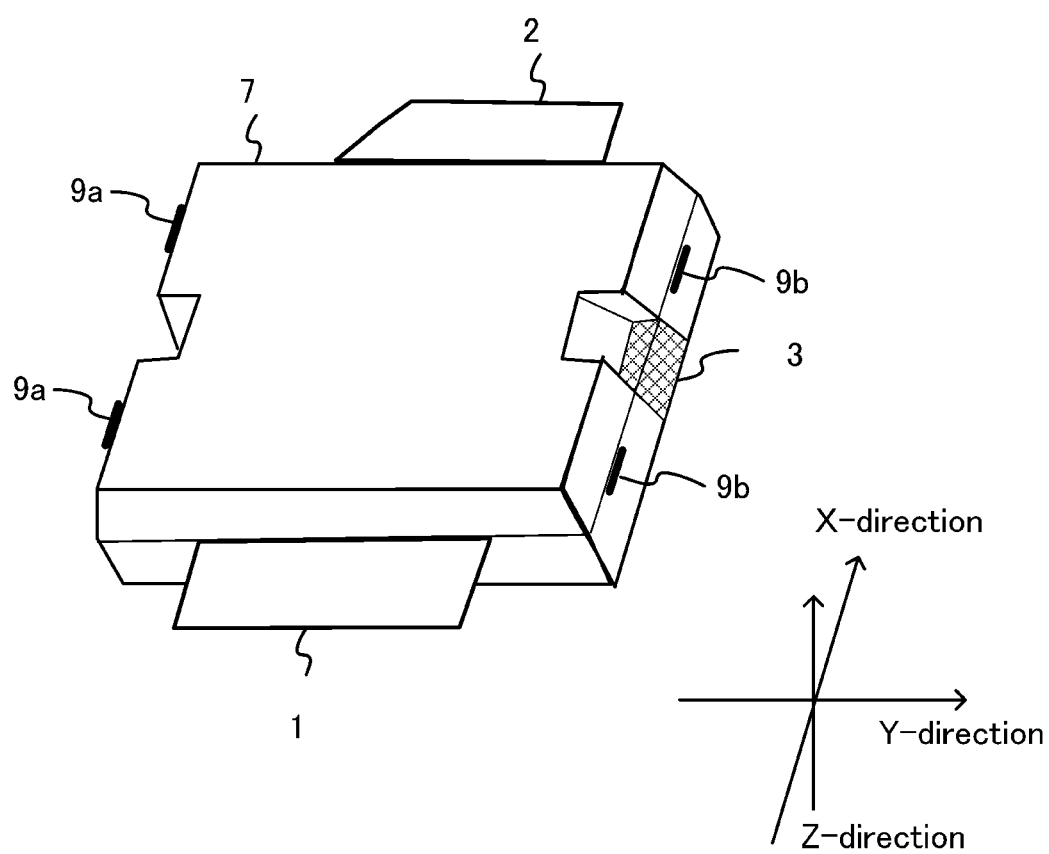
FIG. 1 is a drawing which explains the outer appearance structure of a semiconductor device in accordance with the embodiments of the present application.

Hereinafter, a semiconductor device according to the embodiments of the present application will be described, with reference to drawings. Incidentally, the same reference numerals are given to those identical or similar to constitutional portions in respective drawings and the size and/or the scale size of the corresponding respective constitutional portions are respectively independent. For example, when the identical constitutional portions, which are not changed, are shown, the size and/or the scale size of the identical constitutional portions may be different among sectional views in which a part of the configuration is changed. Furthermore, although the configurations of the semiconductor device are further actually provided with a plurality of members, for ease of explanation, only portions necessary for explanation will be described and other portions are omitted.

Embodiment 1

Explanation will be given to the structure of a semiconductor device in accordance with the embodiments of the present application, with reference to drawings. FIG. 1 is a schematic diagram which represents an outer appearance of the semiconductor device in accordance with the embodiments. The semiconductor device 100 in accordance with the embodiments of the present application is composed of a drain electrode terminal 1, a gate electrode terminal 2, a heat sink 3, a mold resin 7, lead frames 9, and the like. On the heat sink 3, a semiconductor chip and a circuit board are mounted. The semiconductor chip is provided with a drain electrode, a gate electrode, and a source electrode. The semiconductor chip, the circuit board, the lead frame 9, and the heat sink 3 are sealed with the mold resin 7.

The heat sink 3 has a heat radiation surface (a rear surface), a mounting surface (an upper surface), and a side surface. The semiconductor chip and the circuit board are mounted on the mounting surface of the heat sink 3. Heat which is released from the semiconductor chip and the circuit board is radiated toward the outside from the heat radiation surface of the heat sink 3. In the semiconductor device 100 according to the embodiments of the present application, the heat sink 3 works also as a source electrode terminal. The semiconductor device 100 in accordance with the embodiments of the present application is suitable for outputting electric power of 1 W or more, at a frequency of 1 GHz or more. The heat sink 3 has a thermal conductivity of 200 mW/K or more.

Lead frames 9a and 9b to which lead cutting is performed, are fixed to the rear surface (the heat radiation surface) of the heat sink 3. The semiconductor device (a package) is divided into an individual piece, by performing lead cutting to the lead frames 9a and 9b. In the drawing, a direction which heads from the drain electrode terminal 1 to the gate electrode terminal 2 will be referred to as Direction X. Further, a direction which heads from the heat radiation surface (the rear surface or the base surface) of the heat sink 3 to the mounting surface (the upper surface) of the heat sink 3 will be referred to as Direction Z. Further, a direction which heads from the lead frame 9a to the lead frame 9b will be referred to as Direction Y.

Figure 2:
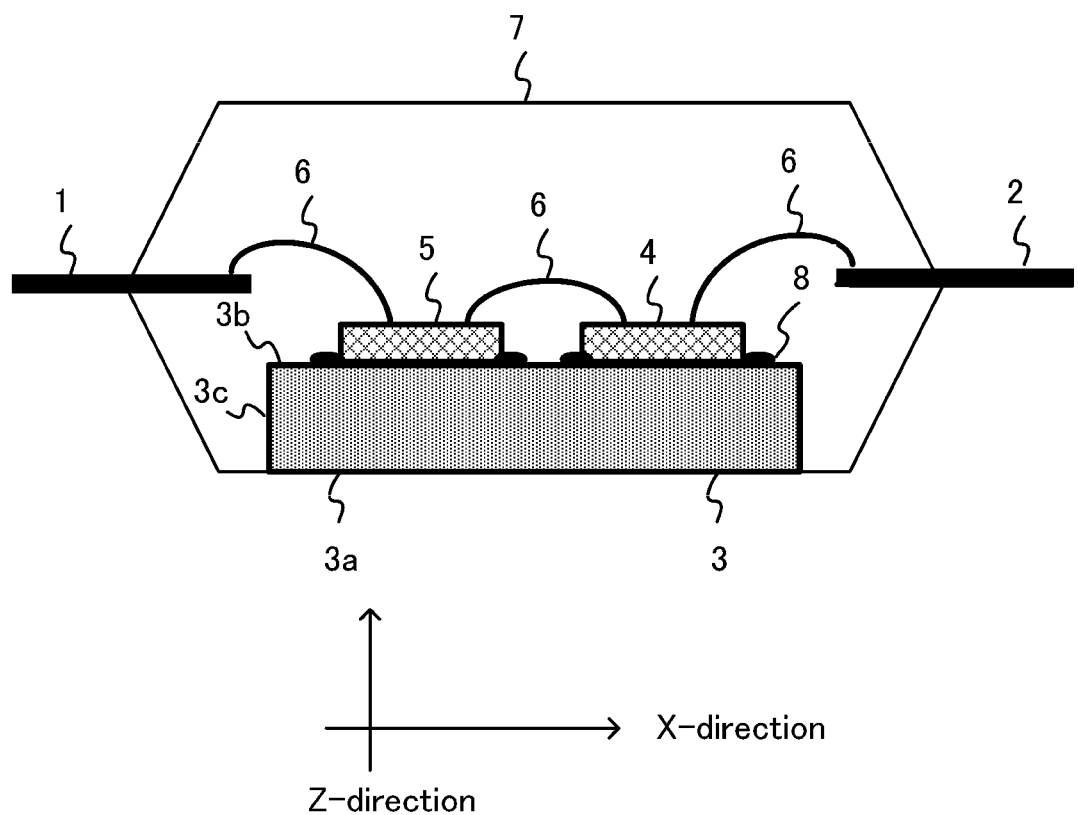
FIG. 2 is a drawing which explains the structure of electrode terminals of a semiconductor device in accordance with the embodiments of the present application.

FIG. 2 is a section drawing which shows the structure of a semiconductor device 100 in accordance with the present embodiment. The heat sink 3 has a heat radiation surface 3a, a mounting surface 3b, and a side surface 3c. On the heat sink 3, a semiconductor chip 4 and a circuit board 5 are mounted with die bonding materials 8, such as of Ag paste resin, solder, and sintered Ag. The semiconductor chip 4, like a Si device, a GaAs device, and a GaN device, is disposed on the upper surface (the mounting surface) of the heat sink 3. The drain electrode terminal 1 is connected, by bonding wires 6, with the drain electrode of the semiconductor chip 4.

The gate electrode terminal 2 is connected, by bonding wires 6, with the gate electrode of the semiconductor chip 4. The heat sink 3 is connected with the source electrode of the semiconductor chip 4. The semiconductor chip 4 and the circuit board 5 are sealed with the mold resin 7, after wire connection is conducted by bonding wires 6, such as of Au, Ag, and Al. The rear surface (the heat radiation surface) of the heat sink 3 is opened, and is revealed from the mold resin.

Figure 3:
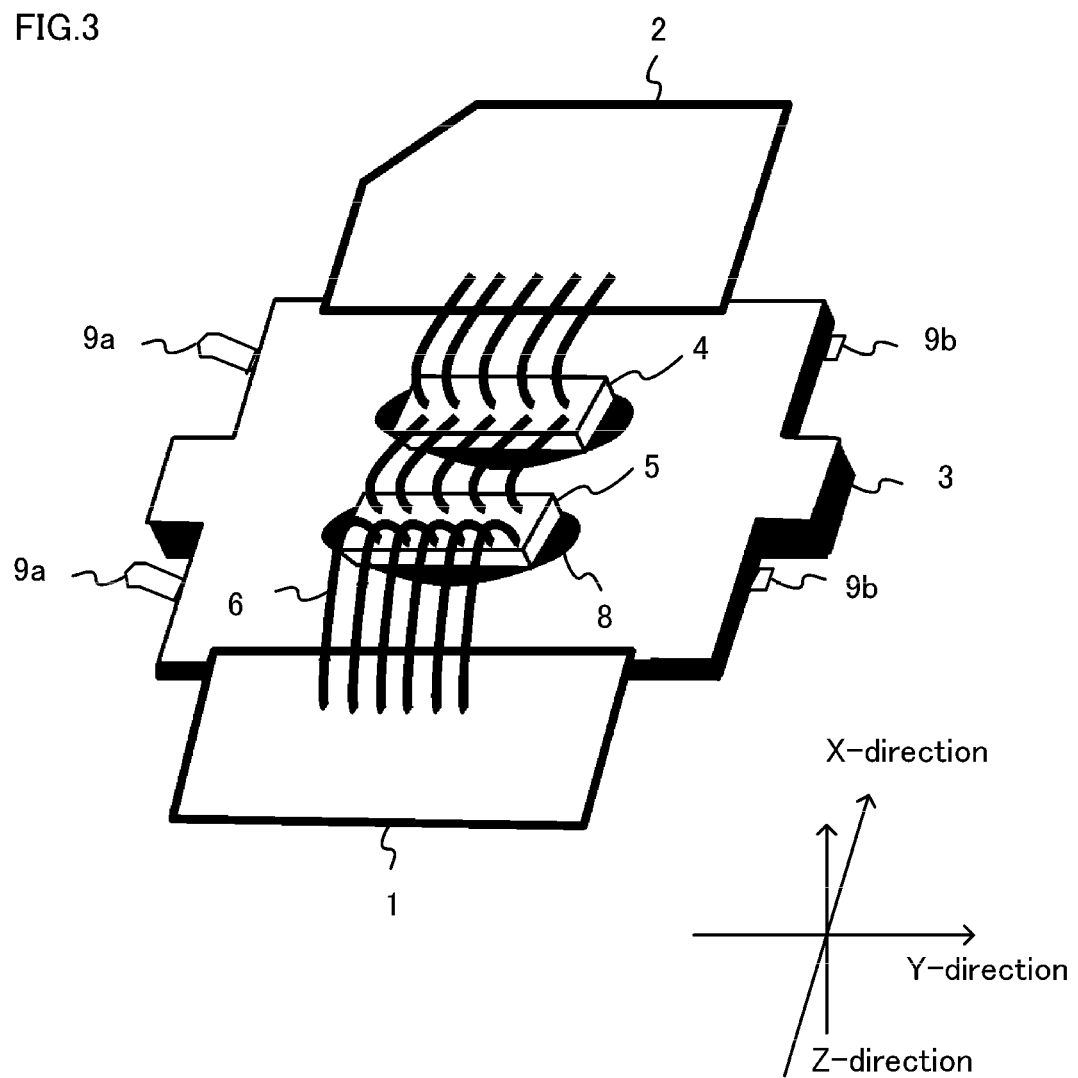
FIG. 3 is a drawing which explains the structure of the lead frames of a semiconductor device in accordance with Embodiment 1.

FIG. 3 is a perspective view which shows the structure of the heat sink 3 in accordance with the present embodiment. The semiconductor chip 4 and the circuit board 5 are fixed to the upper surface (the mounting surface) of the heat sink 3, with die bonding materials 8, such as of Ag paste resin, solder, and sintered Ag. The lead frame 9 has a lead with two or more terminals. Lead frames 9a and 9b are fixed to the rear surface (the heat radiation surface) of the heat sink 3. The semiconductor chip 4 and the circuit board 5 are wired, by bonding wires 6, with the drain electrode terminal 1 and the gate electrode terminal 2.

In order to protect the semiconductor device 100 from foreign substances, external forces, and the like, the semiconductor chip 4 and the circuit board 5 will be sealed with the mold resin 7. In the drawing, lead cutting is performed to the lead frames 9a and 9b. Performing lead cutting to the lead frame 9 divides semiconductor devices (packages) into individual pieces. The direction (Direction X) which connects the drain electrode terminal 1 and the gate electrode terminal 2 intersects at a right angle with the direction (Direction Y) which connects the lead frame 9a and the lead frame 9b.

Figure 4:
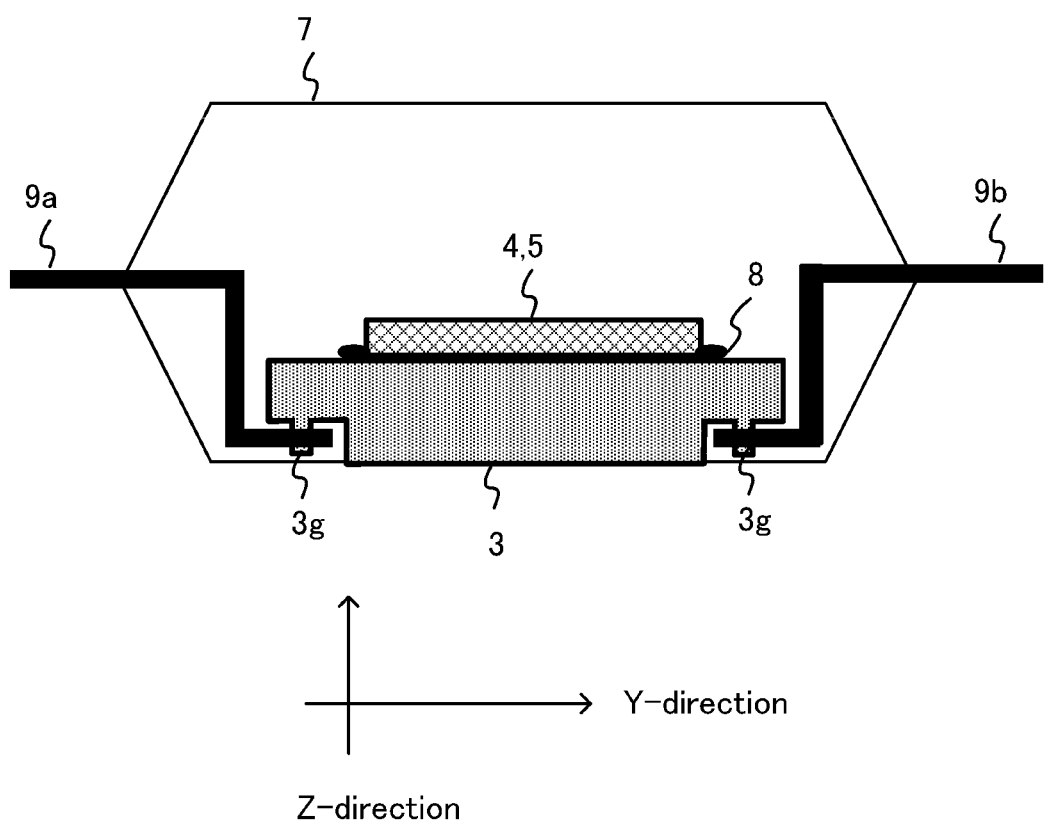
FIG. 4 is a drawing which explains the structure of the heat sink of the semiconductor device in accordance with Embodiment 1.

FIG. 4 is a schematic cross section drawing which shows the structure of the semiconductor device 100 in accordance with the present embodiment. The semiconductor chip 4 and the circuit board 5 are fixed to the upper surface (the mounting surface) of the heat sink 3, with die bonding materials 8, such as of Ag paste resin, solder, and sintered Ag. The lead frame 9 has a lead with two or more terminals. The heat sink 3 has dowels 3g at the rear surface (the heat radiation surface) side. The lead frame 9 and the heat sink 3 are fixed together, by swaging the dowels 3g, which are formed on the heat radiation surface of the heat sink 3, with the lead frames 9a and 9b. The mold resin 7 seals the semiconductor chip 4, the circuit board 5 and others, in order to protect the semiconductor device 100 from foreign substances, external forces, and the like. Performing lead cutting to the lead frames 9a and 9b divides semiconductor devices (packages) into individual pieces.

Figure 5:
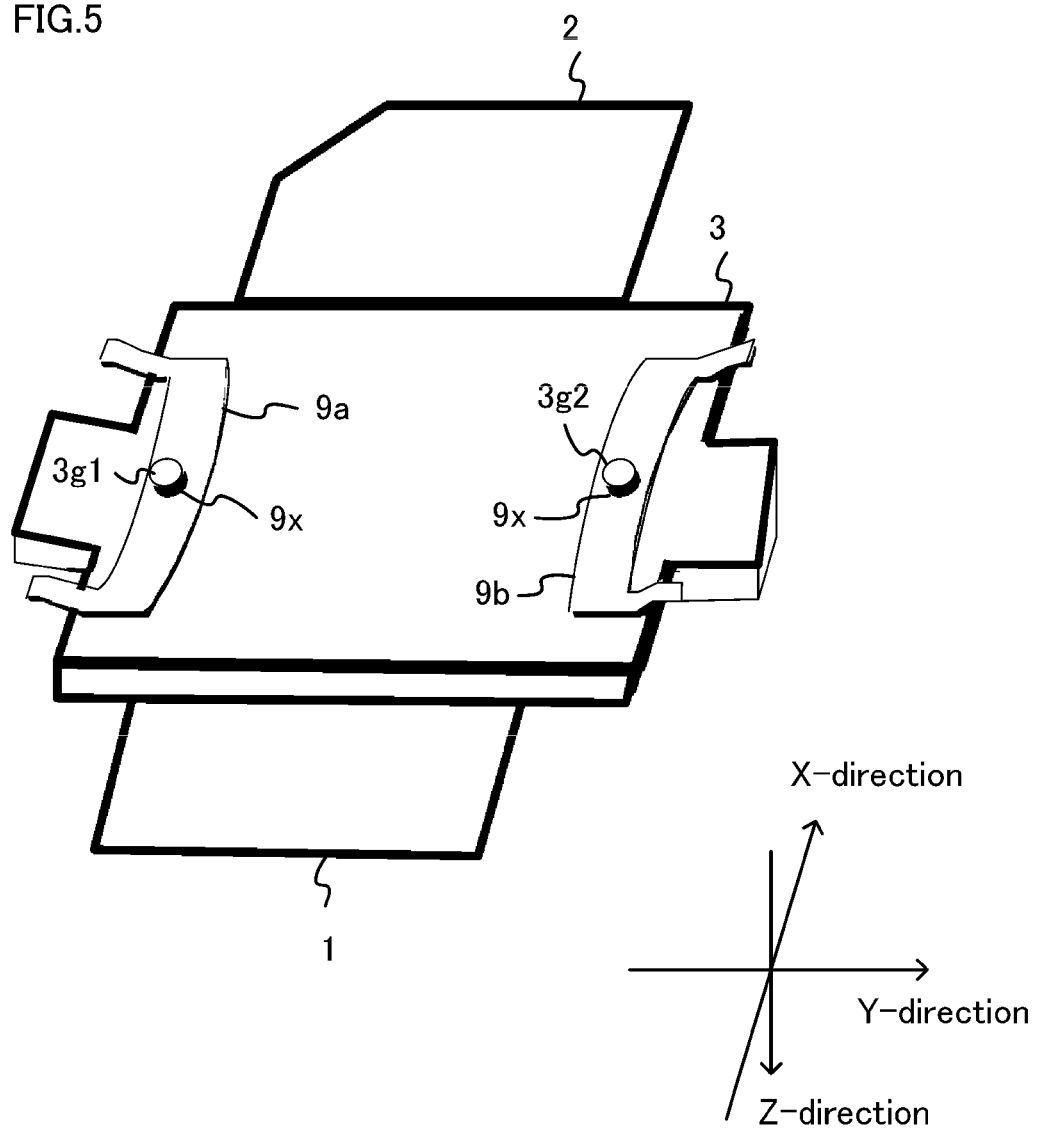
FIG. 5 is a drawing which explains the structure of the lead frames of the semiconductor device in accordance with Embodiment 1.

FIG. 5 is a schematic diagram which shows the structure of the heat sink 3 in accordance with the present embodiment. The drawing represents a rear side shape of the heat sink 3. With regard to the heat sink 3, a dowel 3g1 and a dowel 3g2, which serve as engagement parts, are formed on the rear surface (the heat radiation surface). An engaging hole 9x which can engage with the dowel 3g is opened to the lead frame 9a and the lead frame 9b. The dowel 3g1, with which the engaging hole 9x of the lead frame 9a is fitted, is engaged therewith. The dowel 3g2, with which the engaging hole 9x of the lead frame 9b is fitted, is engaged therewith. The lead frame 9 and the heat sink 3 are fixed together, by swaging the dowel 3g of the heat sink 3 with the lead frame 9. The semiconductor chip 4 and the circuit board 5 are mounted on the front surface (the mounting surface) of the heat sink 3.

According to the structure in which a dowel and swaging exist on the upper surface (the mounting surface) of the heat sink 3, a region which cannot be used for component mounting is produced, since fixing is performed between the heat sink 3 and the lead frame 9. According to the semiconductor device in accordance with the present embodiment, neither a dowel nor swaging exists on the upper surface (the mounting surface) of a heat sink. Since the whole upper surface of the heat sink is available for component mounting, the size reduction of a package (a semiconductor device) can be attained. That is to say, since the semiconductor device in accordance with the present embodiment can use the whole upper surface (the mounting surface) of a heat sink for component mounting, it becomes possible to reduce the size of a package (a semiconductor device), compared with former devices.

Among the semiconductor devices which output electric power of 1 W or more, at a frequency of 1 GHz or more, a semiconductor device in accordance with the present embodiment has a heat sink with a thermal conductivity of 200 mW/K or more, and is characterized in that a lead frame and a heat sink is fixed together, by inserting the lead frame, having a lead with two or more terminals, into a groove provided in the side surface of the heat sink. The semiconductor device is sealed with mold resin, after wire connection is performed by bonding wires, of Au, Ag, Al, and the like, where a Si device, a GaAs device, and a GaN device are mounted on the upper surface of the heat sink, with die bonding material, such as Ag paste resin, solder, and sintered Ag.

In other words, the semiconductor device 100 in accordance with the embodiments of the present application includes: a heat sink which has a mounting surface, a heat radiation surface, a side surface and an engagement part, a semiconductor chip which is mounted on the mounting surface of the heat sink, a lead frame which is engaged with the engagement part of the heat sink, and a mold resin which seals the heat sink, the semiconductor chip and the lead frame, wherein the engagement part of the heat sink is disposed at a place which avoids the mounting surface of the heat sink.

Embodiment 2

The semiconductor device 100 in accordance with an embodiment of the present application is composed of a drain electrode terminal 1, a gate electrode terminal 2, a heat sink 3, a mold resin 7, lead frames 9, and the like. On the heat sink 3, a semiconductor chip and a circuit board are mounted. The semiconductor chip is provided with a drain electrode, a gate electrode, and a source electrode. The semiconductor chip, the circuit board, the lead frames 9, and the heat sink 3 are sealed with the mold resin 7. The heat sink 3 works also as a source electrode terminal.

The semiconductor device 100 in accordance with the embodiment of the present application is suitable for outputting electric power of 1 W or more, at a frequency of 1 GHz or more. The heat sink 3 has a thermal conductivity of 200 mW/K or more. The heat sink 3 has a heat radiation surface (a rear surface), a mounting surface (an upper surface), and a side surface. The lead frames 9 are fixed to the rear surface of the heat sink 3. The semiconductor chip and the circuit board are mounted on the mounting surface of the heat sink 3. Heat which is released from the semiconductor chip and the circuit board is radiated toward the outside from the heat radiation surface of the heat sink 3.

FIG. 6 is a schematic cross section drawing which shows the structure of the semiconductor device 100 in accordance with the embodiment of the present application. On the upper surface (the mounting surface) of the heat sink 3, a semiconductor chip 4 and a circuit board 5 and others are fixed, with die bonding materials 8, such as of Ag paste resin, solder, and sintered Ag. The lead frame 9 has a lead with two or more terminals. The heat sink 3 has, on the side surface, dowels 3f which serve as engagement parts. An engaging hole 9x which can engage with a dowel 3f is opened to the lead frame 9a and the lead frame 9b. The left side dowel 3f, with which the engaging hole 9x of the lead frame 9a is fitted, is engaged therewith. The right side dowel 3f, with which the engaging hole 9x of the lead frame 9b is fitted, is engaged therewith.

The lead frame 9 and the heat sink 3 are fixed together, by swaging the dowels 3f of the heat sink 3 with the lead frames 9a and 9b. The mold resin 7 in accordance with the embodiment of the present application seals the semiconductor chip 4 and the circuit board 5, in order to protect the semiconductor device 100 from foreign substances, external forces, and the like. The semiconductor device 100 in accordance with the present embodiment is a semiconductor device which is characterized in that a lead frame and a heat sink are fixed together, by swaging the lead frame with a dowel provided in the side surface of the heat sink.

According to the structure in which a dowel and swaging exist on the upper surface (the mounting surface) of the heat sink 3, a region which cannot be used for component mounting is produced, since fixing is performed between the heat sink 3 and the lead frame 9. According to the semiconductor device in accordance with the present embodiment, neither a dowel nor swaging exists on the upper surface (the mounting surface) of a heat sink. Since the whole upper surface of the heat sink is available for component mounting, the size reduction of a package (a semiconductor device) can be attained. That is to say, since the semiconductor device in accordance with the present embodiment can use the whole upper surface (the mounting surface) of a heat sink for component mounting, it becomes possible to reduce the size of a package (a semiconductor device), compared with former devices.

Embodiment 3

The semiconductor device 100 in accordance with an embodiment of the present application is composed of a drain electrode terminal 1, a gate electrode terminal 2, a heat sink 3, a mold resin 7, lead frames 9, and the like. On the heat sink 3, a semiconductor chip and a circuit board are mounted. The semiconductor chip is provided with a drain electrode, a gate electrode, and a source electrode. The semiconductor chip, the circuit board, the lead frames 9, and the heat sink 3 are sealed with the mold resin 7. The heat sink 3 works also as a source electrode terminal.

The semiconductor device 100 in accordance with the embodiment of the present application is suitable for outputting electric power of 1 W or more, at a frequency of 1 GHz or more. The heat sink 3 has a thermal conductivity of 200 mW/K or more. The heat sink 3 has a heat radiation surface (a rear surface), a mounting surface (an upper surface), and a side surface. The lead frames 9 are fixed to the rear surface of the heat sink 3. The semiconductor chip and the circuit board are mounted on the mounting surface of the heat sink 3. Heat which is released from the semiconductor chip and the circuit board is radiated toward the outside from the heat radiation surface of the heat sink 3.

Figure 7:
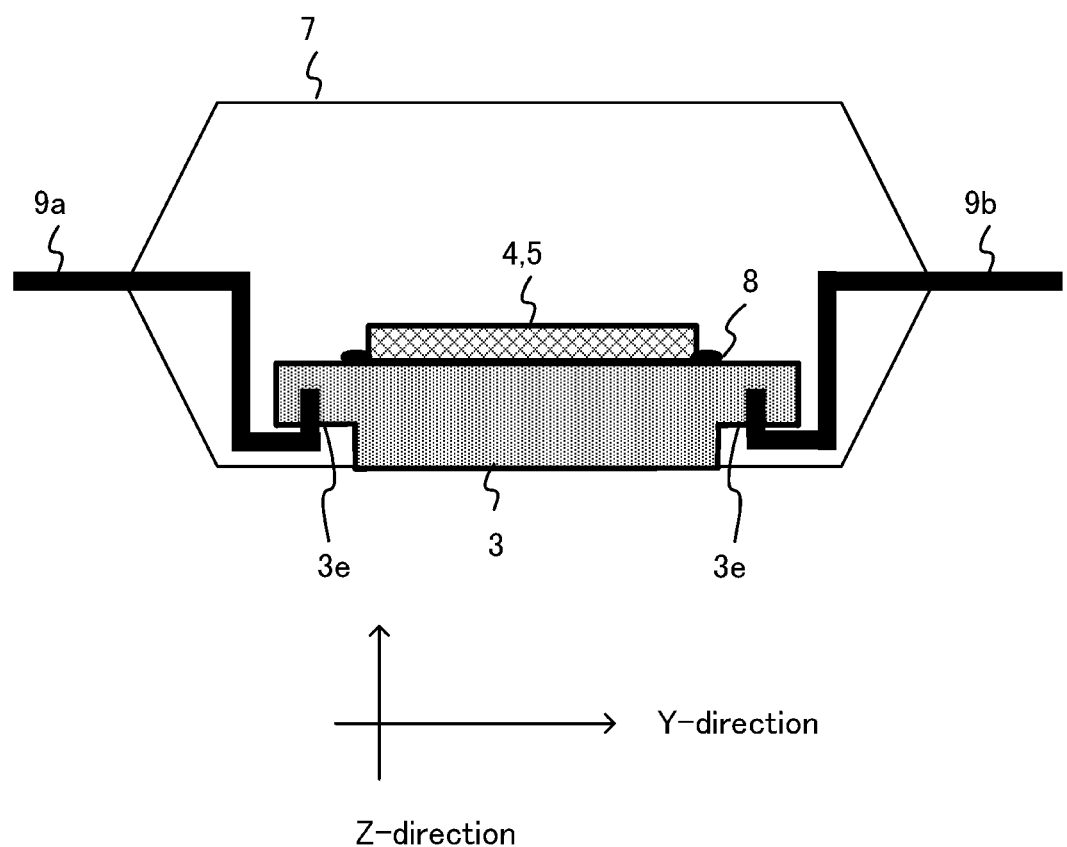
FIG. 7 is a drawing which explains the structure of the lead frames of a semiconductor device in accordance with Embodiment 3.

FIG. 7 is a schematic cross section drawing which shows the structure of the semiconductor device 100 in accordance with the embodiment of the present application. On the upper surface (the mounting surface) of the heat sink 3, a semiconductor chip 4 and a circuit board 5 and others are fixed, with die bonding materials 8, such as of Ag paste resin, solder, and sintered Ag. The lead frame 9 has a lead with two or more terminals. The heat sink 3 has, on the rear surface, grooves 3e which serve as engagement parts. The grooves 3e are formed in a longitudinal direction, which heads from the rear surface toward the upper surface of the heat sink 3, and does not penetrate through the upper surface of the heat sink.

The left side groove 3e of the heat sink, with which the lead frame 9a is fitted, is engaged therewith. The right side groove 3e of the heat sink, with which the lead frame 9b is fitted, is engaged therewith. The lead frame 9 and the heat sink 3 are fixed together, by inserting the lead frame 9a and the lead frame 9b into the grooves 3e of the heat sink 3.

The mold resin 7 in accordance with the embodiment of the present application seals the semiconductor chip 4 and the circuit board 5, in order to protect the semiconductor device 100 from foreign substances, external forces, and the like. Therefore, the semiconductor device 100 in accordance with the embodiment of the present application is a semiconductor device which is characterized in that a lead frame and a heat sink are fixed together, by inserting the lead frame into the groove provided on the rear surface of the heat sink. It is to be noted that the groove in accordance with the embodiment of the present application can have a V shaped configuration or a U shaped configuration.

According to the structure in which a dowel and swaging exist on the upper surface (the mounting surface) of the heat sink 3, a region which cannot be used for component mounting is produced, since fixing is performed between the heat sink 3 and the lead frame 9. According to the semiconductor device in accordance with the present embodiment, neither a dowel nor swaging exists on the upper surface (the mounting surface) of a heat sink. Since the whole upper surface of the heat sink is available for component mounting, the size reduction of a package (a semiconductor device) can be attained. That is to say, since the semiconductor device in accordance with the present embodiment can use the whole upper surface (the mounting surface) of a heat sink for component mounting, it becomes possible to reduce the size of a package (a semiconductor device), compared with former devices.

Embodiment 4

The semiconductor device 100 in accordance with an embodiment of the present application is composed of a drain electrode terminal 1, a gate electrode terminal 2, a heat sink 3, a mold resin 7, lead frames 9, and the like. On the heat sink 3, a semiconductor chip and a circuit board are mounted. The semiconductor chip is provided with a drain electrode, a gate electrode, and a source electrode. The semiconductor chip, the circuit board, the lead frames 9, and the heat sink 3 are sealed with the mold resin 7. The heat sink 3 works also as a source electrode terminal.

The semiconductor device 100 in accordance with the embodiment of the present application is suitable for outputting electric power of 1 W or more, at a frequency of 1 GHz or more. The heat sink 3 has a thermal conductivity of 200 mW/K or more. The heat sink 3 has a heat radiation surface (a rear surface), a mounting surface (an upper surface), and a side surface. The lead frames 9 are fixed to the rear surface of the heat sink 3. The semiconductor chip and the circuit board are mounted on the mounting surface of the heat sink 3. Heat which is released from the semiconductor chip and the circuit board is radiated toward the outside from the heat radiation surface of the heat sink 3.

FIG. 8 is a schematic cross section drawing which shows the structure of the semiconductor device 100 in accordance with the embodiment of the present application. On the upper surface (the mounting surface) of the heat sink 3, a semiconductor chip 4 and a circuit board 5 and others are fixed, with die bonding materials 8, such as of Ag paste resin, solder, and sintered Ag. The lead frame 9 has a lead with two or more terminals. On the side surface, the heat sink 3 has grooves 3d, which serve as engagement parts. The groove 3d is formed on the side surface of the heat sink 3, covering the whole length of the side surface.

The left side groove 3d of the heat sink 3, with which the lead frame 9a is fitted, is engaged therewith. The right side groove 3d of the heat sink 3, with which the lead frame 9b is fitted, is engaged therewith. The lead frame 9 and the heat sink 3 are fixed together, by inserting the lead frame 9a and the lead frame 9b into the grooves 3d of the heat sink 3.

The mold resin 7 in accordance with the embodiment of the present application seals the semiconductor chip 4 and the circuit board 5, in order to protect the semiconductor device 100 from foreign substances, external forces, and the like. Therefore, the semiconductor device in accordance with the embodiment of the present application is a semiconductor device which is characterized in that a lead frame and a heat sink are fixed together, by inserting the lead frame into the groove provided on the side surface of the heat sink. The groove in accordance with the embodiment of the present application can have a V shaped configuration or a U shaped configuration.

According to the structure in which a dowel and swaging exist on the upper surface (the mounting surface) of the heat sink 3, a region which cannot be used for component mounting is produced, since fixing is performed between the heat sink 3 and the lead frame 9. According to the semiconductor device in accordance with the embodiment of the present application, neither a dowel nor swaging exists in the upper surface (the mounting surface) of a heat sink. Since the whole upper surface of the heat sink is available for component mounting, the size reduction of a package (a semiconductor device) can be attained. That is to say, since the semiconductor device in accordance with the present embodiment can use the whole upper surface (the mounting surface) of a heat sink for component mounting, it becomes possible to reduce the size of a package (a semiconductor device), compared with former devices.

Note that, with regard to the technology which is disclosed in the specification of the present application, each of the embodiments can be freely combined, appropriately modified and/or eliminated without departing from the scope of the invention.

EXPLANATION OF NUMERALS AND SYMBOLS

1 Drain electrode terminal, 2 Gate electrode terminal, 3 Heat sink, 3d Groove, 3e Groove, 3f Dowel, 3g Dowel, 4 Semiconductor chip, 5 Circuit board, 6 Bonding wire, 7 Mold resin, 8 Die bonding material, 9 Lead frame, 9a Lead frame, 9b Lead frame, 100 Semiconductor device

What is claimed is:

1. A semiconductor device, comprising:
   a heat sink which has a mounting surface, a heat radiation surface, a side surface, a first engagement part, and a second engagement part,
   a semiconductor chip which is mounted on the mounting surface of the heat sink,
   a first lead frame which is directly physically attached to the first engagement part of the heat sink,
   a second lead frame which is directly physically attached to the second engagement part of the heat sink, and
   a mold resin which seals the heat sink, the semiconductor chip, the first lead frame and the second lead frame, wherein
   the first engagement part and the second engagement part of the heat sink are disposed at a place which avoids the mounting surface of the heat sink.

2. The semiconductor device according to claim 1, wherein
   the first engagement part and the second engagement part are dowels formed in the heat radiation surface.

3. The semiconductor device according to claim 1, wherein
   the first engagement part and the second engagement part are dowels formed in the side surface.

4. The semiconductor device according to claim 1, wherein
   the first engagement part and the second engagement part are grooves formed in the heat radiation surface.

5. The semiconductor device according to claim 1, wherein
   the first engagement part and the second engagement part are grooves formed in the side surface.

6. The semiconductor device according to claim 1, wherein
   the heat radiation surface is revealed from the mold resin.

7. The semiconductor device according to claim 2, wherein
   the heat radiation surface is revealed from the mold resin.

8. The semiconductor device according to claim 3, wherein
   the heat radiation surface is revealed from the mold resin.

9. The semiconductor device according to claim 4, wherein
   the heat radiation surface is revealed from the mold resin.

10. The semiconductor device according to claim 5, wherein
    the heat radiation surface is revealed from the mold resin.

11. The semiconductor device according to claim 1, wherein
    the semiconductor chip has a drain electrode, a gate electrode and a source electrode, and the heat sink is connected with the source electrode.

12. The semiconductor device according to claim 11, further comprising:
    a drain electrode terminal which is connected by a bonding wire with the drain electrode of the semiconductor chip, and
    a gate electrode terminal which is connected by a bonding wire with the gate electrode of the semiconductor chip.

13. The semiconductor device according to claim 12, wherein
    a direction which connects the first lead frame and the second lead frame intersects at a right angle with a direction which connects the drain electrode terminal and the gate electrode terminal.

14. The semiconductor device according to claim 1, further comprising:
    a circuit board which is mounted on the mounting surface of the heat sink, wherein the circuit board is sealed with the mold resin.

15. The semiconductor device according to claim 1, wherein
    the first engagement part and the second engagement part of the heat sink protrude from or recess into a respective surface of the heat sink.

16. The semiconductor device according to claim 1, wherein
    the side surface of the heat sink extends from the mounting surface to the heat radiation surface.

* * * * *